United States Patent

[11] 3,612,112

[72] Inventors William Jordan Siegel
Silver Spring;
Linus E. Wallgren, Rockville; Loring E. Young, Frederick, all of Md.

[21] Appl. No. 829,301
[22] Filed June 2, 1969
[45] Patented Oct. 12, 1971
[73] Assignee Pace, Incorporated
Silver Springs, Md.
by said Wallgren and said Young

[54] ELECTRONIC COMPONENT FORMING TOOL
5 Claims, 5 Drawing Figs.

[52] U.S. Cl. .......... 140/102.5, 140/123, 72/36, 72/482
[51] Int. Cl. .......... B21f 1/00, B21f 45/00
[50] Field of Search .......... 140/102.5, 106, 123; 72/36, 384, 385, 386, 478, 481, 482; 33/143, 158, 159

[56] References Cited
UNITED STATES PATENTS

| | | | |
|---|---|---|---|
| 764,937 | 7/1904 | Friedman | 33/159 |
| 3,151,398 | 10/1964 | Torrey | 72/36 |
| 3,289,446 | 12/1966 | Davey | 33/143 |
| 3,360,018 | 12/1967 | Lindsay | 140/123 |

*Primary Examiner*—Lowell A. Larson
*Attorney*—Fidelman, Wolffe & Leitner

ABSTRACT: The present invention relates to a handtool for forming the leads of electronic components into just the right size and shape for insertion into a circuit board. As shown by the drawing the tool itself comprises an integral T-shaped member with a tailpiece slidably mounted on the leg thereof and capable of being locked thereto. The headpiece portion of the T-shaped member and the slidable tailpiece are in an opposing mirror-image relationship with a set of end portions formed as a pair of locator tips and the opposing end portions as parallel planar surfaces. The planar surfaces have matching apertures therein. When the locator tips are set for the component space, the tailpiece is locked to the leg. Then an electrical component can be positioned between the planar surfaces, and the leads placed in the apertures. Thereafter if the leads are bent against the marginal edges of the apertures the lead spacing will be sized in accord with the distance between the locator tips.

ELECTRONIC COMPONENT FORMING TOOL

This invention relates to an improved handtool used for mounting electronic components in circuit boards. The tool is particularly adapted as a distance-measuring and lead-bending device so that the leads of electrical components can be bent to size and shape exactly commensurate with the space available for the component.

The original manufacturer of any piece of equipment normally employs relatively few circuit board types and relatively few components. Efficient production requires concentration on as little as one product at a time. The same selected components are respectively placed into predetermined locations on circuit board after circuit board. Desirably, a multiplicity of identical units are manufactured. Should final product-testing indicate that a particular faulty electrical component has made one circuit board defective and must be replaced, properly sized replacement components are conveniently at hand.

The repair technician faces an altogether different problem. He must be able to repair all types of electronic gear without regard to their original sources of manufacture. He faces a bewildering variety of circuit board sizes and types, and component sizes and types. The repair technician can not hope always to stock sufficient preassembled circuit boards for a pull and replace repair. More often the individual components are available and component replacement directly on the defective circuit board could be carried out. This leaves the repair technician with a component size problem, because for each repair he must shape the component leads to whatever size is needed for the electronic component to be inserted into the circuit board circuit. Access between components already present in the circuit board is frequently difficult. Measuring the available space may be troublesome.

Typically, electronic components such as conductors, capacitors, resistors, etc. are constructed with oversized connecting leads so that they may be bent easily, then trimmed to fit the intended space. Similarly, circuit boards are conventionally constructed with apertured pads so that leads can be inserted into the aperture and soldered to the sidewall of the pad or clinched over and soldered to the pad on the back side of the circuit board. Therefore the components are capable of insertion in a circuit board, if the repair technician is able to shape and size the leads properly.

A convenient handtool for sizing and bending component leads would greatly facilitate repair of circuit boards.

It is the object of the present invention to provide an improved comforming tool to facilitate mounting electronic components in circuit boards.

A further object of the invention is to provide an improved lead-bending structure in a locator-type tool so that the many component sizes and lead configurations employed in circuit boards can be duplicated.

Still another object is to provide a locator-type tool capable of locating the available spacing in a closely packed circuit board.

Further objects and advantages of the present device will be apparent from the description thereof which follows:

Briefly stated the present tool comprises an integral T-shaped member with a movable tailpiece, slidably mounted on the leg thereof and lockable thereon. The T-shaped head or headpiece portion of the T-shaped main body member and the slidable tailpiece are in an opposing mirror-image relationship. One side or end portion of each (i.e. the bottoms) constitutes a pair of elongated locator tips and the other ends a pair of parallel planar surfaces. The planar surfaces have matching apertures therein to be used for lead-bending purposes. The locator tips are placed in or at the appropriate apertures on the circuit board, then the tailpiece is locked in place on the leg portion of the main body member. Thereafter the electrical component can be positioned between the planar surfaces with the leads of the component in the apertures therein. Bending the leads against the marginal edges of the aperture walls sizes the component to the distance between the locator tips.

For further understanding of this invention reference is now made to the attached drawing illustrating a preferred embodiment of the tool, and wherein.

Figures 1, 2:
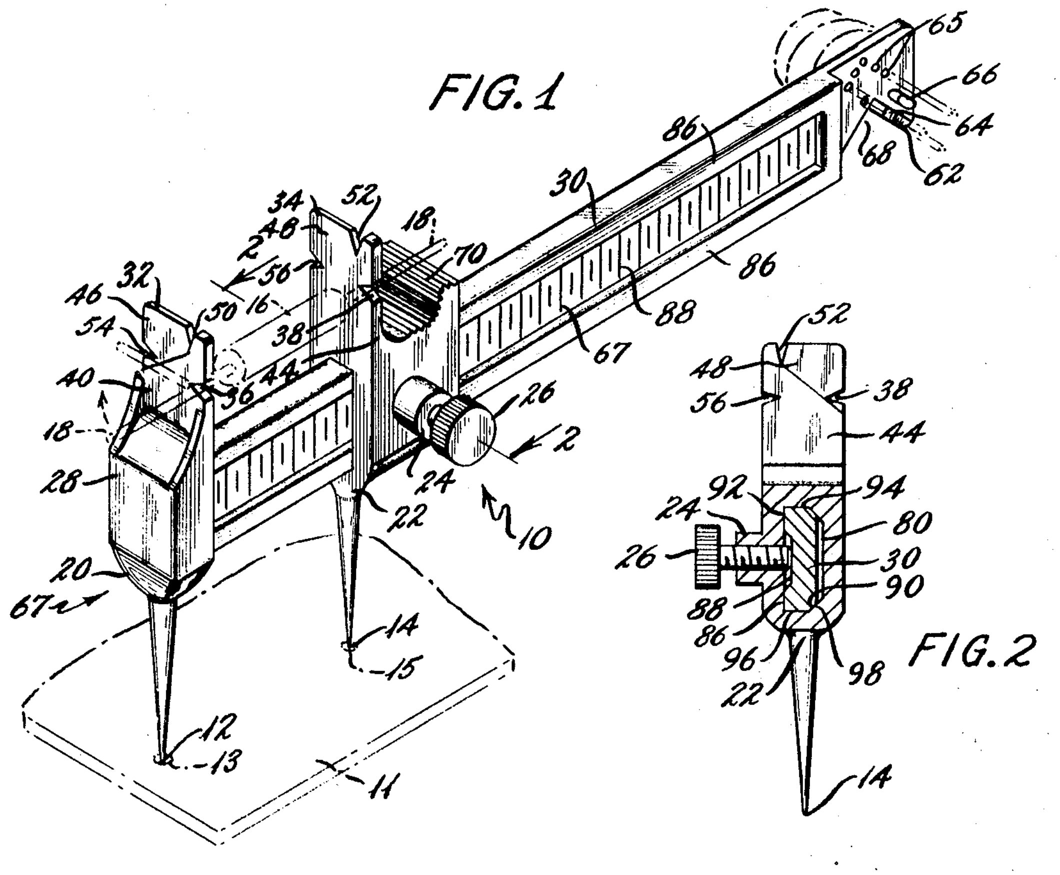
FIG. 1 is a diagrammatic view of the handtool.
FIG. 2 is a section taken along the line 2—2 of FIG. 1.
Figure 3:
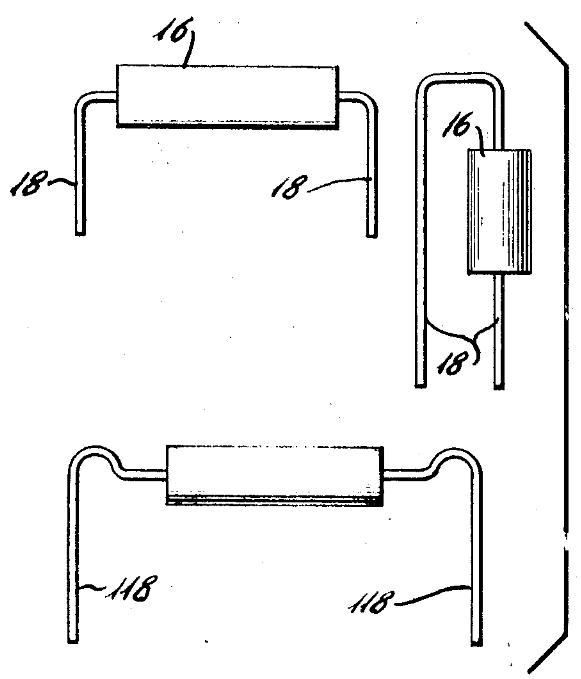
FIG. 3 shows electrical components with leads bent to size in the handtool.

As illustrated in FIG. 1 tool 10 is shown with its elongated locator tips 12 and 14 positioned at apertures 13, 15 of circuit board 11. A resistor 16 is shown associated with tool 10 with leads 18 thereof already bent to size.

Tool 10 comprises a T-shaped body member 20 having an extended leg portion 30 integral with headpiece portion 28. A tailpiece member 22 is slidably mounted on leg portion 30. The front face of tailpiece member 22 has a threaded apertured boss 24 therein. A locking screw 26 is threaded in aperture 24. Arbitrarily, and for purposes of simplifying the present description of tool 10, the tool face with threaded apertured boss 24 and locking screw 26 is hereafter termed the front face of tool 10, and locator tips 12 and 14 are considered as being at the bottom of tool 10.

Tailpiece 22 and the headpiece 28 of main body 20 form a pair of opposing mirror-image members extending laterally (up and down) from leg portion 30 in a face-to-face opposing relation. Below the level of leg portion 30 headpiece and tailpiece thin down into a rounded pair of elongated locator tips 12 and 14 having almost needlelike ends. Above leg portion 30 the head and tailpieces flatten out to form parallel planar surfaces 32, 34 with matching apertures, e.g. notches, 36, 38 therein. Back surfaces 40 and 44 also are flat and parallel. When the leads are bent against the marginal edges of notches 36, 38 and wiped back along the flat parallel rear surfaces 40 and 44 the bends made in leads 18 become right-angle bends.

For reasons explained hereafter a pair of parallel recessed surfaces 46, 48 are also formed on the back faces. Top notches 50, 52 and rear notches 54, 56 are associated therewith.

Figures 4, 5:
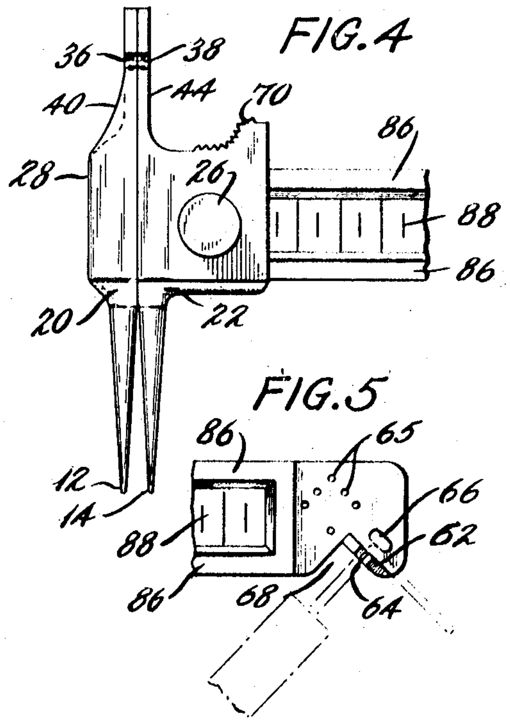
FIG. 4 is a reduced-size front view of the head end of the handtool in closed position.
FIG. 5 is an enlarged front view of the rear end of the handtool.

As may be noted in FIG. 4, locator tips 12 and 14 are offset one from the other a distance generally corresponding to the material thickness and are spaced approximately the distance between the rear surfaces 40 and 44. Accordingly when an electrical component such as resistor 16 is placed on the tool 10 with leads 18 inside notches 36 and 38, and the leads bent back against the tool material at the marginal edges of the notches the right-angle bend so created makes the distance between the bent lead ends correspond almost exactly to the spacing between locator tips 12 and 14. In a preferred embodiment where the tool material thickness notches 36 and 38 are one-sixteenth inch locator tip 12 is offset the same one-sixteenth inch from the plane of upper surface 32 and correspondingly locator tip 14 is offset the same one-sixteenth inch from the plane of upper surface 34; in this preferred embodiment recessed rear surfaces 46, 48 are of half thickness (i.e. one thirty-second inch). When leads 18 are bent in top notches 50, 52 or rear notches 54, 56 the lead ends will be short (by one-sixteenth inch) of the spacing indicated by locator tips 12, 14.

The above dimensions for material thickness, e.g. one-sixteenth inch, correspond to the minimum distance from components, like resistor 16, to the first bend in its lead 18 usually specified. Sometimes in original manufacture a smaller distance has been employed. For replacement of components with short bend distances, or even otherwise if the component has relatively thick leads and the bending radius is material, use of the half-thickness marginal recesses 54, 56 or 50, 52 for lead bending may be advisable.

Normal usage for tool 10 involves positioning locator tips inside openings 13 and 15 on circuit board 11, and then locking tailpiece 22 to leg portion 30 by threading in locking screw 26. Thereafter tool 10 may be removed from circuit board 11 so that it can be manipulated for placement of an electrical component 16 with leads 18 in matching notches and held while the leads 18 are bent back against the marginal edges of the notches.

The lead ends may of course be trimmed to proper length before the component is soldered to the circuit board.

Allusion has been made to the extreme variety which exists in components and circuit boards. Correspondingly, the structure of tool 10 is adapted for varied usage. Presence of recessed rear surfaces 46, 48 is one such instance.

At the end of leg portion 30 provision is made for placing a strain relief loop in the component leads. As may be seen in the drawings a V-cutout 68 is provided at the rear of leg portion 30. Directly on the edge of the V-cutout is a raised section 62 with a notch 64 centrally thereof and directly to the rear of notch 64 and spaced apart therefrom is a short upstanding barrier segment 66 with rounded-off end edges. To place a strain relief loop in leads 18 a right-angle bend is made in the lead. The lead end is then place with the right-angle bend inside notch 64 and the lead end extending in the channel between raised section 62 and barrier 66 (see FIG. 5). Thereafter, whipping the lead end 180° around the end edges of barrier 66 reverses the direction of lead 18 and imparts thereto a stress relief rounded-off section exactly the thickness of barrier 66. For convenience the barrier 66 is made the same thickness, e.g. one-sixteenth inch previously selected.

Other use features may be built into tool 10 without disturbing the principal function described alone. Thus in the same region as the stress relief loop forming is provided multiplicity of perforations 65, six being illustrated. These perforations are designed for use as lead straighteners for transistors, integrated circuits etc. When as often is the case, their fine lead wires have become bent, even tangled. Placement of the leads through perforations 65 permits straightening of individual leads and trimming to any desired length.

Should the user wish to known exactly how far apart are the holes in the circuit board 17, a scale 67 may be marked along the length of leg portion 30.

The scale 67 serves a positive function when stress relief loops are placed in leads 18. The loops made in tool 10 add about one-eighth inch to the lead spacing. Therefore when locator tips 12, 14 locate the true spacing on circuit board, tailpiece 22 should be locked to leg 30, one-eighth inch short of the true spacing. Doing so is conveniently simple with scale 67 directly on leg portion 30. Then when the leads are bent in apertures 36, 38 and a stress relief loop is placed on each lead the lead spacing accurately corresponds to the measured spacing.

As a convenience to hand manipulation of tool 10 the tailpiece 22 is constructed with a ridged thumb grip 70 facilitating thereby a controlled careful positioning of tailpiece 22 along the length of leg portion 30.

Since accurate and stable spacing of locator tips 12, 14 is so important to proper use of tool 10, a special locking arrangement is present to secure tailpiece 22 to leg portion 30. The locking structure is in the enclosed guideway 80 of tailpiece 22 and on the leg portion 30 of the T-body 20. Thus, the top and bottom surfaces of leg portion 30 are straight planar guide surfaces. A third planar guide surface is provided by the flat ridges 86 built into the front face of leg portion 30. Between ridges 86 is a channel 88 into which the tail of locking screw 26 fits. In locked position the tail of locking screw 26 seats against the base of channel 88 (shown in FIG. 2). A pair of bevelled edges 90 are provided at the rear edges of the top and bottom surfaces of leg portion 30. Correspondingly, enclosed guideway 80 of tailpiece 22 has a front planar surface 92, and planar top and bottom guide surfaces 94 and 96 each provided with an angled bevel 98 at the rear thereof. However, inside guideway 80 the bevel extends further back than the corresponding bevelled edges 90 on leg portion 30 as is illustrated in the drawing. The distance front to rear across guideway 80 is greater than the thickness of leg portion 30. Accordingly when locking screw 26 is tightened up, forcing leg portion 30 rearward against the tailpiece 22, the matching bevelled edges 90 and 98 act as wedges sliding one against the other, until locking frictional engagement is effected. Use of the bevelled edges as the rear wedging and locking surfaces allows for a good fit of leg portion 30 with guideway 80 with a stability which causes the distance measurement made by locator tips 12, 14 to be most accurate.

Allusion has already been made to some exemplary dimensions and to the possibility of demarcating lengths on leg portion 30. Conveniently, tool 10 may be made throughout with known dimensions as an aid to those repair technicians who measure things by whatever instrument may be at hand (rather than look for a rule). In a preferred embodiment the distance front to rear of planar surface 32 or 34 on the head and tailpiece 22 and 28 is three-eighth inch and the length of the leg portion 30, 4 inches. The material thickness at transistor-straightening holes 65 may be one-sixteenth.

The tool 10 itself may of course be metallic, either stamped or cast, but in a preferred embodiment thereof tool 10 is formed from a fiberglass-filled nylon resin by conventional plastics-molding techniques.

What is claimed is:

1. A tool for locating spaced-apart openings in a circuit board and for sizing the lead spacing of electrical components to be mounted in said openings which comprises: a T-shaped member having an elongated leg portion and a headpiece portion; a tailpiece member slidably mounted on said elongated leg portion, said tailpiece member extending laterally of the leg portion in an opposing face-to-face mirror-image relation to said head piece portion; and locking means for locking the tailpiece member to said leg portion at any desired position along the length thereof, one end of said headpiece portion and the corresponding end of said tailpiece being shaped into a pair of locator tips, the other end of the headpiece portion and the opposing end of the tailpiece being formed with parallel planar surfaces having matched apertures therein, thereby permitting an electrical component to be positioned between said planar surfaces with the leads thereof in said apertures whereby the leads may be bent against the margins of the apertures to space the electrical component lead ends in accord with the distance between said locator tips.

2. A tool as in claim 1 wherein the locator tips are offset one from the other a distance equal to the material thickness of the tool at the apertured planar surfaces, whereby the leads of electrical components bent in the apertures become spaced apart the distance between said locator tips.

3. A tool as in claim 2 wherein a recessed rear planar portion is provided on said headpiece portion and on said tailpiece behind the planar surfaces, and apertures are provided thereat.

4. A tool as in claim 1 wherein said leg portion has parallel upper and lower guide surfaces thereon with bevelled edges at the rear thereof and wherein said tailpiece has an enclosed guideway therein with parallel upper and lower guide surfaces and bevelled edges at the rear thereof matching the guide surfaces of said leg portion, said tailpiece further having a threaded aperture in the front face thereof and a threaded locking member mounted therein, whereby rotation inward of the threaded locking member against the front surface of said leg portion wedges the bevelled rear edges together into locked position.

5. A tool as in claim 1 wherein strain relief loop-forming means are provided at the base end of said elongated leg portion thereof.